(12) United States Patent
Mueller et al.

(10) Patent No.: US 10,411,160 B2
(45) Date of Patent: Sep. 10, 2019

(54) OPTOELECTRONIC COMPONENT HAVING STRAY RADIATION

(71) Applicant: OSRAM Opto Semiconductors GmbH, Regensburg (DE)

(72) Inventors: Jens Mueller, Regensburg (DE); Christine Höss, Regensburg (DE); Jens Dennemarck, Regensburg (DE); Johann Koller, Ebermannsdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 177 days.

(21) Appl. No.: 15/525,433

(22) PCT Filed: Nov. 10, 2015

(86) PCT No.: PCT/EP2015/076217
§ 371 (c)(1),
(2) Date: May 9, 2017

(87) PCT Pub. No.: WO2016/075142
PCT Pub. Date: May 19, 2016

(65) Prior Publication Data
US 2018/0287012 A1     Oct. 4, 2018

(30) Foreign Application Priority Data
Nov. 11, 2014   (DE) .......................... 10 2014 223 003

(51) Int. Cl.
*H01L 33/00* (2010.01)
*H01L 33/22* (2010.01)
(Continued)

(52) U.S. Cl.
CPC .......... *H01L 33/22* (2013.01); *G01R 31/2635* (2013.01); *H01L 33/007* (2013.01);
(Continued)

(58) Field of Classification Search
CPC ......... H01L 33/02; H01L 33/22; H01L 33/32; H01L 33/42
See application file for complete search history.

(56) References Cited

U.S. PATENT DOCUMENTS

2006/0273336 A1* 12/2006 Fujikura ................ H01L 33/42
257/98
2009/0095973 A1   4/2009 Tanaka et al.
(Continued)

FOREIGN PATENT DOCUMENTS

| CN | 1641893 A | 7/2005 |
|---|---|---|
| CN | 102157640 A | 8/2011 |
| CN | 107112393 A | 8/2017 |

OTHER PUBLICATIONS

First Office Action dated Sep. 5, 2018, of counterpart Chinese Application No. 201580061260.2, including a Search Report, in English.

*Primary Examiner* — Phuc T Dang
(74) *Attorney, Agent, or Firm* — DLA Piper LLP (US)

(57) ABSTRACT

An optoelectronic component includes an active zone that generates electromagnetic radiation, wherein the electromagnetic radiation is guided in a guide plane, the electromagnetic radiation is output essentially in the guide plane, the active zone emits stray radiation laterally with respect to the guide plane, an electrical contact pad is provided, the contact pad is arranged outside the guide plane, the contact pad is formed by a surface at least partially covered by a conductive layer, the surface has inclined partial faces, and the electrically conductive layer on at least a subset of the inclined faces of the contact pad is configured to be so thin that electromagnetic stray radiation is emitted via the subset of the inclined faces.

19 Claims, 4 Drawing Sheets

(51) Int. Cl.
*H01L 33/42* (2010.01)
*H01S 5/042* (2006.01)
*H01S 5/02* (2006.01)
*G01R 31/26* (2014.01)
*H01L 33/32* (2010.01)
*H01S 5/223* (2006.01)

(52) U.S. Cl.
CPC .......... *H01L 33/0095* (2013.01); *H01L 33/32* (2013.01); *H01L 33/42* (2013.01); *H01S 5/0207* (2013.01); *H01S 5/0425* (2013.01); *H01L 33/0045* (2013.01); *H01L 2933/0016* (2013.01); *H01S 5/2231* (2013.01)

(56) References Cited

U.S. PATENT DOCUMENTS

| | | | |
|---|---|---|---|
| 2010/0025713 A1* | 2/2010 | Tao | H01L 33/0079 257/98 |
| 2010/0224899 A1* | 9/2010 | Kang | H01L 33/14 257/98 |
| 2011/0089451 A1* | 4/2011 | Jeong | H01L 33/40 257/98 |
| 2011/0193121 A1* | 8/2011 | Jeong | H01L 33/405 257/98 |
| 2011/0244610 A1 | 10/2011 | Saito et al. | |
| 2012/0273828 A1* | 11/2012 | Wei | H01L 21/0237 257/99 |
| 2014/0016661 A1* | 1/2014 | Orita | H01L 33/02 372/50.1 |
| 2014/0048817 A1 | 2/2014 | Gardner et al. | |
| 2014/0168656 A1 | 6/2014 | Suga et al. | |
| 2018/0287012 A1 | 10/2018 | Mueller et al. | |

\* cited by examiner

OPTOELECTRONIC COMPONENT HAVING STRAY RADIATION

TECHNICAL FIELD

This disclosure relates to an optoelectronic component, a method of producing an optoelectronic component, and a method of testing an optoelectronic component.

BACKGROUND

Laser diodes are known which have an active zone, wherein the active zone generates electromagnetic radiation guided in a guide plane. The electromagnetic radiation is output essentially in the guide plane. In addition, stray radiation from the active zone is generated laterally with respect to the guide plane. Outside the guide plane, the laser diode has electrical contacts provided to supply the active zone with charge carriers.

To check the functionality of the laser diode, the electromagnetic radiation output via the guide plane is evaluated.

It could nonetheless be helpful to provide an improved optoelectronic component, an improved method of producing the optoelectronic component, and an improved test method.

SUMMARY

We provide an optoelectronic component including an active zone that generates electromagnetic radiation, wherein the electromagnetic radiation is guided in a guide plane, the electromagnetic radiation is output essentially in the guide plane, the active zone emits stray radiation laterally with respect to the guide plane, an electrical contact pad is provided, the contact pad is arranged outside the guide plane, the contact pad is formed by a surface at least partially covered by a conductive layer, the surface has inclined partial faces, and the electrically conductive layer on at least a subset of the inclined faces of the contact pad is configured to be so thin that electromagnetic stray radiation is emitted via the subset of the inclined faces.

We also provide a method of producing an optoelectronic component having an active zone that generates electromagnetic radiation, the electromagnetic radiation is guided in a guide plane, including outputting the electromagnetic radiation in the guide plane, wherein the active zone emits stray radiation laterally with respect to the guide plane, with a contact pad, and the contact pad has a surface covered by an electrically conductive layer, arranging the contact pad outside the guide plane, wherein the surface has an average roughness greater than 0.1 µm, producing the surface by a mechanical and/or chemical removal method such that the surface has faces inclined with respect to the guide plane, and configuring the electrically conductive layer on at least a subset of the inclined faces of the contact pad to be so thin that electromagnetic stray radiation may be emitted.

We further provide a method of testing an optoelectronic component having an active zone that generates electromagnetic radiation, the electromagnetic radiation is guided in a guide plane, the electromagnetic radiation is output essentially in the guide plane, the active zone emits stray radiation laterally with respect to the guide plane, with a contact pad, the contact pad has a surface covered by an electrically conductive layer, the contact pad is arranged outside the guide plane, the surface has an average roughness greater than 0.1 µm, the surface has faces inclined relative to the guide face, and the electrically conductive layer on at least a subset of the inclined faces of the surface is configured to be so thin that electromagnetic stray radiation is emitted, including measuring the electromagnetic radiation emitted via the inclined faces, and evaluating the measured amount to assess a quality of the component.

LIST OF REFERENCE NUMERALS

Figure 1:
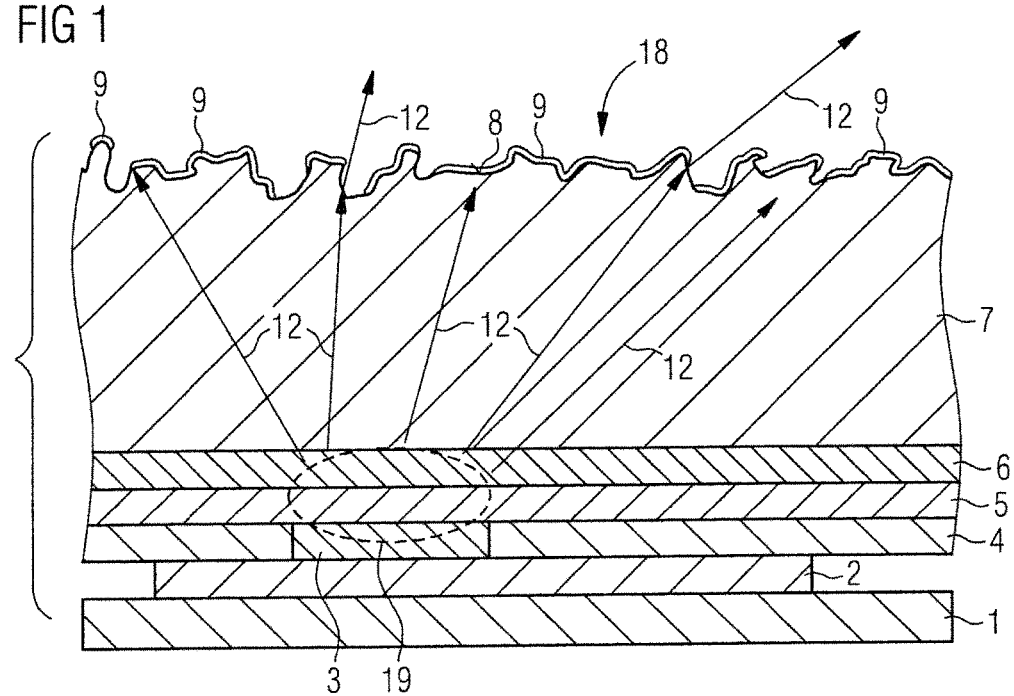
FIG. 1 shows a schematic cross section through a structure of an optoelectronic component.

1 Carrier
2 Contact pad
3 Contact
4 Passivation layer
5 First epitaxial layer
6 Second epitaxial layer
7 Substrate
8 Surface
9 Conductive layer
10 First side
11 Second side
12 Stray radiation
13 Evaluation device
15 Inclined partial face
16 Bonding wire
17 Contact ball
18 Contact pad
19 Laser mode
20 Electromagnetic radiation
21 Partial face of the contact pad
22 Directed deposition
23 Center plane
24 Angle

DETAILED DESCRIPTION

One advantage of our component is that the functionality of the component may be checked with the aid of the stray radiation, wherein the stray radiation is output via an electrical contact pad. Thus, it is also possible to check components whose electromagnetic radiation emission face is difficult to access or inaccessible to pick up a measuring signal.

One advantage of our method is that an electrical contact pad having a surface made up of a semiconductor material is created with the aid of simple methods, wherein the surface is covered by a conductive layer. The surface has inclined faces, wherein on at least a subset of the inclined faces, the conductive layer is configured to be so thin that electromagnetic stray radiation is emitted.

The described test method has the advantage that an assessment of the functionality of the component is possible, in that stray radiation emitted via an electrical contact pad is evaluated to assess the functionality of the component.

The surface may have an average roughness greater than 0.1 µm, in particular greater than 1.2 µm. This roughness is sufficient to create the desired inclined faces. In addition, this roughness may be created using simple and rapid methods, for example, with the aid of mechanical removal methods or chemical removal methods. Thus, the component may be produced rapidly and economically.

The surface may have a mean roughness depth having roughness peaks greater than 1 μm, preferably greater than 5 μm, in particular greater than 10 μm. With the aid of these orders of magnitude for the roughness peaks, a sufficient number of inclined faces may be provided. Thus, a sufficient area is obtained on the electrical contact pads, via which stray radiation is emitted. As a result, the evaluation of the stray radiation to assess the functionality of the component is improved.

The electrically conductive layer may be configured in the form of a metal layer. Metals provide the desired layer thicknesses for the electrically conductive layer. In this way, a low ohmic resistance may be achieved, wherein furthermore, the electrically conductive layer on the inclined faces may be configured to be so thin that electromagnetic stray radiation is emitted.

The electrically conductive layer may have a layer thickness of less than 20 nm on at least a subset of the inclined faces. In this way, the electrically conductive layer is configured to be so thin on the inclined faces that sufficient electromagnetic stray radiation may be emitted through the electrically conductive layer via the areas of the inclined faces. In addition, the conductive layer has a thickness of 50 nm or greater, in particular 200 nm, perpendicular to the guide plane. Thus, a low ohmic resistance is achieved to operate the optoelectronic component.

The layer thickness of the electrically conductive layer on the inclined faces may also be less than 10 nm, in particular less than 1 nm. In this way, the power of the stray radiation emitted via the contact pad is increased.

The active zone may have a spacing of less than 40 μm, in particular less than 5 μm, from the contact pad. By this spacing, it is ensured that sufficient electromagnetic stray radiation is emitted via the contact pad to check the functionality of the component.

The contact pad may be constituted of a surface of a thinned substrate layer. For example, gallium nitride or silicon carbide is possible as a material for the substrate layer.

The component may have an n-terminal and a p-terminal, wherein the p-terminal is mounted on a carrier. In particular, the decoupling of the electromagnetic stray radiation via the n-contact as an electrical contact pad is advantageous to be able to test the component in a simple manner.

The above-described properties, features and advantages and the manner in which they are achieved will be explained more clearly and comprehensively in conjunction with the following description of the examples, which are explained in greater detail in conjunction with the drawings.

FIG. 1 shows a schematic cross-section depiction of an optoelectronic component, for example, configured as a laser diode or as an LED. A carrier 1 is provided, on which a contact pad 2 is arranged. A contact 3 is arranged on the contact pad 2, which contact is surrounded by a passivation layer 4. The passivation layer 4 provides for electrical passivation of the contact 3. At least one positively conductive epitaxial layer 5 is arranged on the contact layer 3 and the passivation layer 4. Thus, the contact 3 constitutes a p-contact. At least one negatively doped and electrically conductive epitaxial layer 6 is arranged on the positively doped and electrically conductive epitaxial layer. The epitaxial layers form an active zone that generates electromagnetic radiation. The active zone may, for example, have a thickness of 1 to 10 μm.

A negatively doped and electrically conductive substrate 7 is arranged on the second epitaxial layer 6. The negatively conductive substrate 7 may, for example, be configured in the form of gallium nitride or silicon carbide. The negatively conductive substrate 7 has a surface 8. The surface 8 has an average roughness greater than 0.1 μm. In particular, the average roughness of the contact pad 8 may be greater than 1.2 μm. Furthermore, the contact pad may have a mean roughness depth Rz having roughness peaks greater than 1 μm, preferably greater than 5 μm, in particular greater than 10 μm.

An electrically conductive layer 9 is applied to the surface 8. The conductive layer 9, together with the surface 8, forms a contact pad 18 and thus a second contact. The conductive layer 9 may be configured in the form of a flat metalization, wherein the flat metalization is subdivided into partial faces, wherein the partial faces have different layer thicknesses. The substrate 7 may have a layer thickness of 40 μm to 200 μm. In addition, the conductive layer 9 may have a layer thickness less than 20 nm at least in one partial face, i.e., in a subset of inclined faces of the surface 8. Gold, silver, copper, titanium, platinum, nickel, chrome, tin, indium, or aluminum, or a combination of these elements, may, for example, be provided as material to configure the conductive layer 9. The substrate 7 may also have a thickness of less than 40 μm, in particular less than 6 μm. Thus, the active zone is spaced at a distance of less than 40 μm, in particular less than 6 μm, away from the conductive layer 9.

The substrate 7 may, for example, be produced in that the substrate initially has a greater thickness, wherein the substrate is mechanically and/or chemically thinned from the surface 8, i.e., removed from the surface 8. In this case, mechanical polishing methods and/or chemical/mechanical polishing methods or chemical etching methods may be used.

At an appropriate voltage between the contact 3 and the contact pad 18, electromagnetic radiation is produced in the active zone 5, 6 in the area above the contact 3, which electromagnetic radiation, for example, may be amplified to a laser mode 19 using appropriate mirrors. The laser mode 19 has a propagation direction configured perpendicularly to the page surface of FIG. 1, in the transition area between the first and the second epitaxial layer 5, 6.

Stray radiation 12 is generated laterally with respect to the laser mode 19, which stray radiation is emitted through the contact pad 18 via the thin areas of the conductive layer 9.

Figure 2:
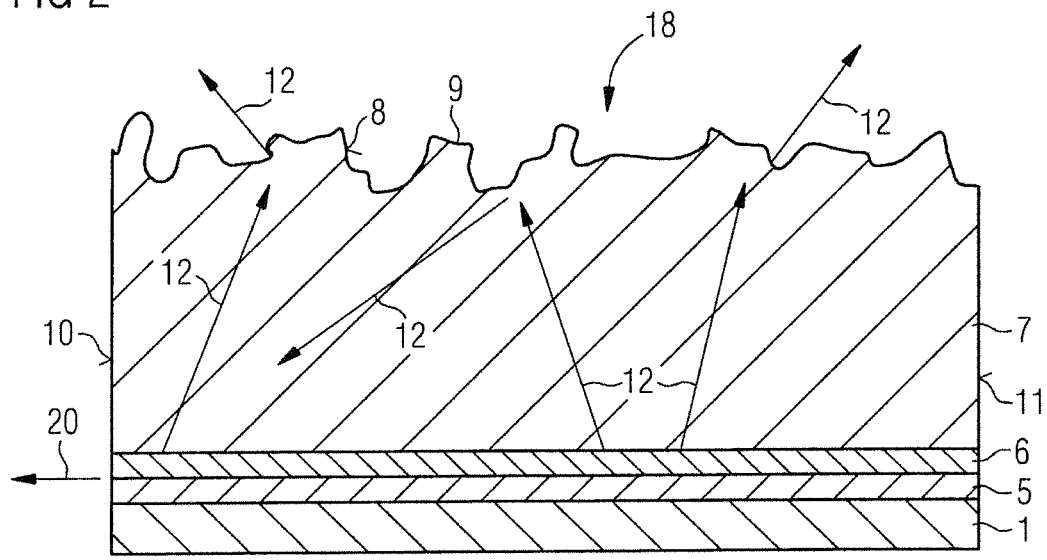
FIG. 2 shows an additional cross section through the component of FIG. 1.

FIG. 2 shows a schematic longitudinal section through the arrangement of FIG. 1. In the depicted examples, the electromagnetic radiation is output to an emission side 10 of the component, in the direction of emission which runs parallel to the pn-interface of the epitaxial layers 6, 5 of the active zone. The emitted electromagnetic radiation 20 is schematically depicted in the form of an arrow.

For this purpose, appropriate mirrors are arranged on both side faces 10, 11. Another portion of the electromagnetic radiation leaves the active zone as stray radiation 12 and reaches the surface 8 of the substrate 7. Due to the appropriately chosen structure of the surface 8 and the chosen conductive layer 9, a portion of the electromagnetic stray radiation 12 is emitted via the contact pad 18.

Figure 3:
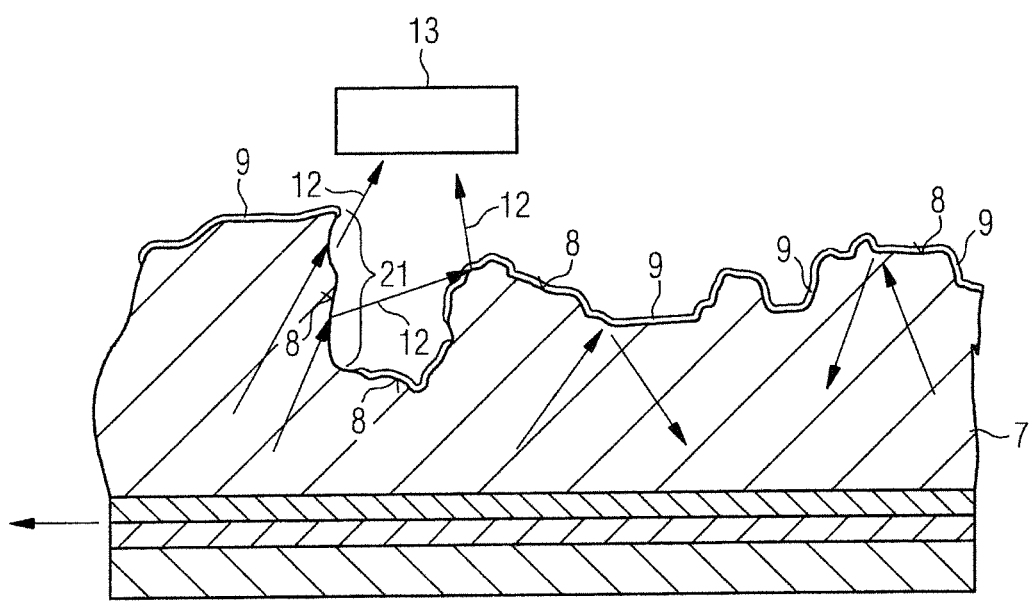
FIG. 3 shows a partial cross section through the surface of the substrate after the conductive layer has been deposited.

FIG. 3 shows a schematically enlarged depiction of a section of the contact pad 8 of the substrate 7 having the conductive layer 9. The conductive layer 9 is applied such that the stray radiation 12 may be emitted at inclined partial faces 21 of the contact pad 18. The arranged partial faces 21 are to be understood to be partial faces inclined at an angle 24 greater than 30°, in particular greater than 60°, with respect to a center plane 23 of the substrate 7. This is achieved in that the conductive layer 9 on the partial faces 21 has a thickness which is very low, or it is not existent at all so that the stray radiation 12 is not blocked by the conductive layer 9. The thickness of the layer 9 on the partial faces 21 is at least partially thinner than 20 nm.

The emitted stray radiation 12 is, for example, captured and analyzed with the aid of an optical evaluating device 13, in particular in the form of a CCD chip. In addition, the contact pad 18 has a low ohmic resistance so that the optoelectronic component may be operated efficiently.

Figure 4:
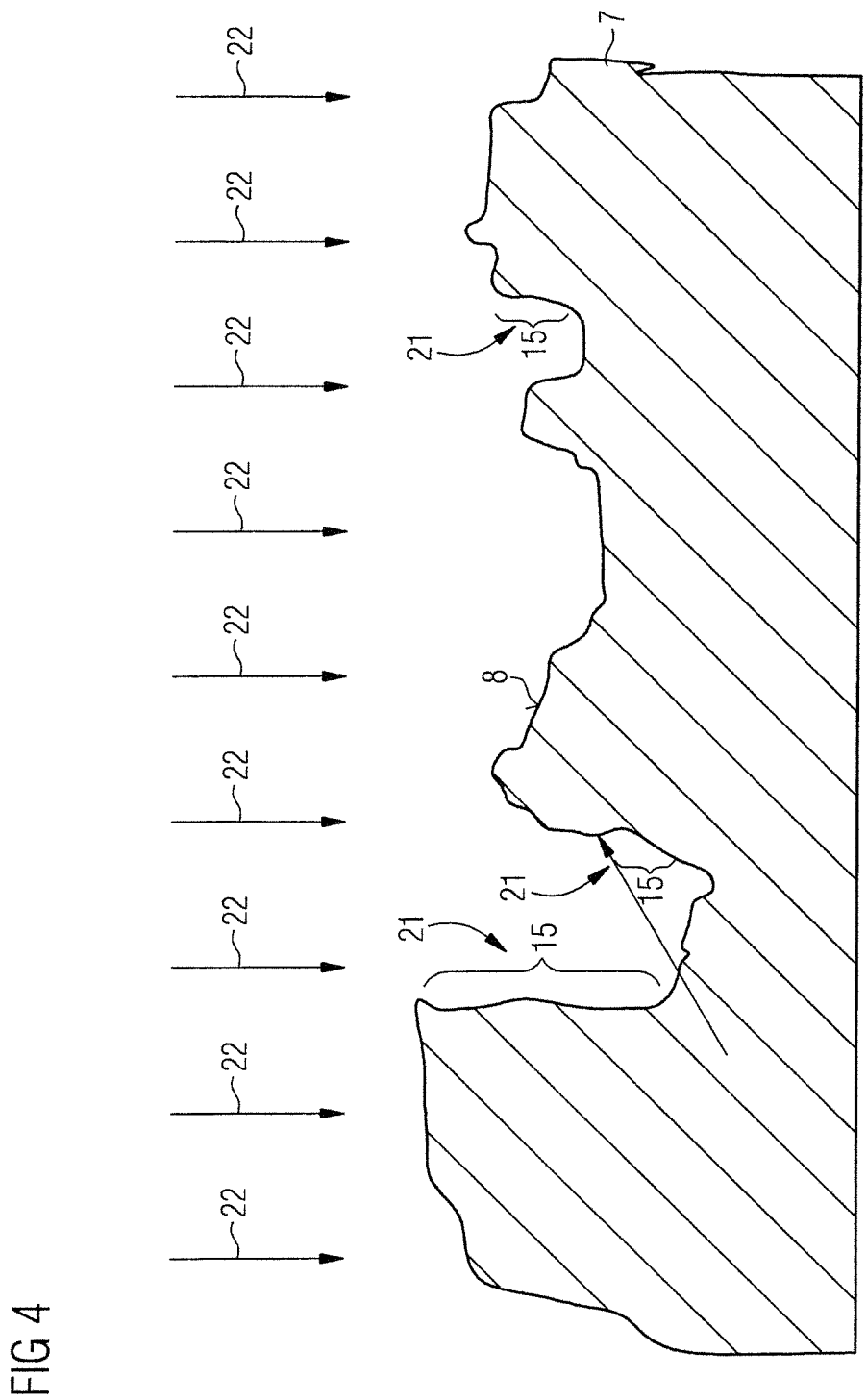
FIG. 4 shows an enlarged depiction of a partial cross section through the surface of the substrate.

The desired structure of the conductive layer 9 is, for example, produced in that the surface 8 of the substrate 7, as depicted in FIG. 4, is roughened or removed with the aid of chemical and/or mechanical methods so that inclined, in particular perpendicular, partial faces 15 are configured on the surface 8. The inclined partial faces 15 are statistically distributed over the surface 8 of the substrate 7 and determined by the choice of the average roughness or by the choice of the roughness peaks.

Subsequently, the conductive layer 9 is deposited onto the surface 8 of the substrate 7 with the aid of a perpendicular deposition 22 or with the aid of a directed deposition 22. By the directed deposition 22, the conductive layer 9 is not deposited on the inclined partial faces 15, or only in the form of a very thin layer. As a result, the structure according to FIG. 3 is obtained.

The surface 8 has an average roughness greater than 100 nm, preferably greater than 500 nm, in particular greater than 1200 nm. In addition, the surface 8 may have roughness peaks greater than 1 µm, preferably greater than 5 µm, in particular greater than 10 µm. The conductive layer 9 of FIG. 3 constitutes a contact pad that is semi-metalized in subareas and is therefore semi-transparent.

Depending on the material used, partial faces of the conductive layer 9 of different thicknesses may be configured on the surface 8 to nevertheless be able to evaluate the stray radiation 12 to assess the functionality of the component.

Figure 5:
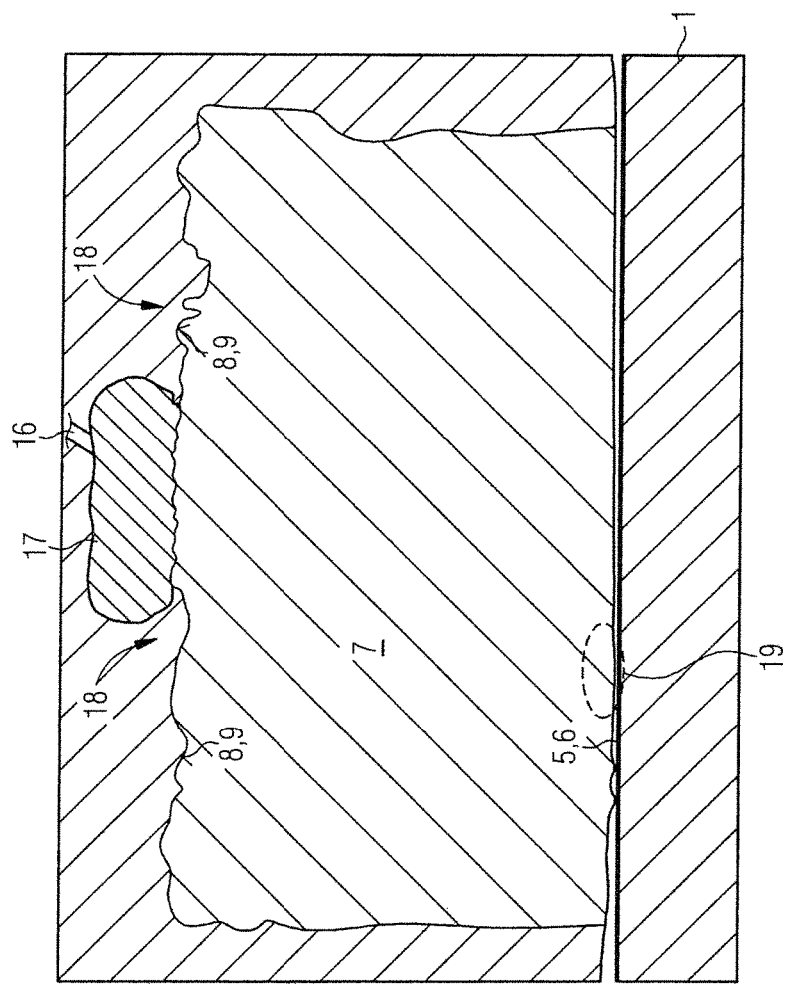
FIG. 5 shows a schematic cross section through a component having a p-down mounting.

FIG. 5 shows a schematic cross section through the component which is configured according to FIG. 1, wherein on the conductive layer 9, a bonding wire 16 is soldered to the conductive layer 9 with the aid of a contact ball 17. In addition, the schematic cross section depicts the optical laser mode 19, which is perpendicular to the image plane. The carrier 1 may, for example, be configured as a heat sink.

Due to the stray radiation emitted upwardly from the substrate 7 via the contact pad 18, attachment of the contact ball 17 and the bonding wire 16 to the conductive layer 9 may be visually checked with the aid of a visual check. In this case, an additional light source may be omitted since the stray radiation 12 emitted by the contact pad 18 may be sufficient to check the correct solder connection between the contact ball 17 and the conductive layer 9. A camera or a light sensor, in particular a CCD chip, may be used to check the configuration of the contact ball 17.

With the aid of the described semi-transparent configuration of the conductive layer 9, the functionality of the optoelectronic component may also be tested if, for example, access to the optical mode is difficult.

The contact pad 2 may, for example, be configured in the form a metalization. The contact 3 may, for example, be configured in the form of a positively doped gallium nitride layer or positively doped aluminum-gallium nitride/gallium nitride layers. In addition, the active zone may be arranged between optical waveguide layers. On the p-side, this may be achieved, for example, in the form of a positively doped gallium nitride layer. On the n-doped side, the cladding layer may also be configured in the form of an n-doped gallium nitride layer. The p- and n-conductive epitaxial layers 5, 6 may be configured in the form of quantum well structures. In addition, a negatively doped aluminum-gallium nitride/gallium nitride layer structure may be provided on the n-side.

The average roughness indicates the average spacing of a measuring point on the surface from the center line. The center line crosses the actual profile within the reference length such that the sum of the profile deviations (relative to the center line) is minimal. The average roughness $R_a$ corresponds to the arithmetic average of the deviation from the center line. In two dimensions, it is calculated as follows:

$$R_a = (1/(M \cdot N)) \Sigma_{n=1}^{M} \Sigma_{n=1}^{N} |z(x_m, y_n) - [z]|$$

The average value [z] is calculated as follows:

$$[z] = (1/(M \cdot N)) \Sigma_{m=1}^{M} \Sigma_{n=1}^{N} z(xm, yn).$$

The mean roughness depth (ten-point average roughness) $R_z$ is ascertained as follows: A defined measuring length on the surface of the workpiece is divided into seven individual measuring lengths of equal size. However, the evaluation is carried out over only five of these lengths since the Gauss filter to be used requires half of a single length of leader or trailer, or a folding has non-negligible run-in and run-out characteristics. The difference between the maxi-mum and minimum value is ascertained from each of the individual measuring lengths of the profile. The average value is formed from the five individual roughness depths thus obtained.

Although our components and methods have been illustrated and described in greater detail via the preferred examples, this disclosure is not limited by the disclosed examples, and other variations may be derived from it by those skilled in the art without departing from the protective scope of the appended claims.

This application claims priority of DE 10 2014 223 003.9, the subject matter of which is incorporated herein by reference.

The invention claimed is:

1. An optoelectronic component comprising an active zone that generates electromagnetic radiation, wherein the electromagnetic radiation is guided in a guide plane, the electromagnetic radiation is output essentially in the guide plane, the active zone emits stray radiation laterally with respect to the guide plane, an electrical contact pad is provided, the electrical contact pad is arranged outside the guide plane, the contact pad is formed by a surface at least partially covered by a conductive layer, the surface has inclined partial faces, and the electrically conductive layer on at least a subset of the inclined faces of the contact pad is configured to be so thin that electromagnetic stray radiation is emitted via the subset of the inclined faces covered by the conductive layer.

2. The component as claimed in claim 1, wherein the surface has an average roughness which is greater than 0.1 µm.

3. The component as claimed in claim 1, wherein the surface has a mean roughness depth having roughness peaks greater than 1 µm.

4. The component as claimed in claim 1, wherein the electrically conductive layer has at least one metal layer.

5. The component as claimed in claim 4, wherein the metal includes at least one element selected from the group consisting of Au, Ag, Cu, Ti, Pt, Ni, Cr, Sn, In and Al.

6. The component as claimed in claim 1, further comprising an electrically conductive substrate and a semiconductor layer structure, wherein the semiconductor layer structure is configured as an active zone, and the electrical contact pad is configured on the substrate.

7. The component as claimed in claim 6, wherein the substrate is configured as a thinned substrate layer.

8. The component as claimed in claim 6, wherein the substrate is formed from GaN or SiC.

9. The component as claimed in claim 1, wherein the conductive layer has a layer thickness of less than 20 nm on at least a subset of the inclined faces of the surface, and the conductive layer has a thickness of 50 nm or greater in other areas of the surface.

10. The component as claimed in claim 1, wherein the active zone has a spacing of less than 40 µm from the contact pad.

11. The component as claimed in claim 1, wherein the component is configured in the form of a laser diode or a light-emitting diode.

12. The component as claimed in claim 1, wherein the contact pad is configured on GaN or SiC.

13. The component as claimed in claim 1, wherein the component has an n-terminal and a p-terminal, and the p-terminal is mounted on a carrier.

14. A method of producing an optoelectronic component having an active zone that generates electromagnetic radiation, the electromagnetic radiation is guided in a guide plane, comprising:
    outputting the electromagnetic radiation in the guide plane, wherein the active zone emits stray radiation laterally with respect to the guide plane, with a contact pad, and the contact pad has a surface covered by an electrically conductive layer, arranging the contact pad outside the guide plane, the surface has an average roughness greater than 0.1 µm,
    producing the surface by a mechanical and/or chemical removal method such that the surface has faces inclined with respect to the guide plane, and
    configuring the electrically conductive layer on at least a subset of the inclined faces of the contact pad to be so thin that electromagnetic stray radiation may be emitted,
    wherein the conductive layer is deposited on at least a subset of the inclined faces of the surface having layer thicknesses of less than 20 nm, and in other areas of the surface, the conductive layer is deposited having a thickness of 50 nm or greater.

15. The method as claimed in claim 14, wherein the electrically conductive layer is deposited onto the surface by a directed deposition method.

16. The method as claimed in claim 14, wherein the conductive layer is formed from a metal.

17. The method as claimed in claim 14, wherein the conductive layer is deposited on at least a subset of the inclined faces of the surface having layer thicknesses of less than 20 nm, and in other areas of the surface, the conductive layer is deposited having a thickness of 50 nm or greater.

18. The component as claimed in claim 14, wherein the conductive layer is deposited having a thickness of 200 nm or greater.

19. A method of testing an optoelectronic component having an active zone that generates electromagnetic radiation, the electromagnetic radiation is guided in a guide plane, the electromagnetic radiation is output essentially in the guide plane, the active zone emits stray radiation laterally with respect to the guide plane, with a contact pad, the contact pad has a surface covered by an electrically conductive layer, the contact pad is arranged outside the guide plane, the surface has an average roughness greater than 0.1 µm, the surface has faces inclined relative to the guide face, and the electrically conductive layer on at least a subset of the inclined faces of the surface is configured to be so thin that electromagnetic stray radiation is emitted, comprising measuring the electromagnetic radiation emitted via the subset of inclined faces covered by the electrically conductive layer, and evaluating the measured amount to assess a quality of the component.

* * * * *